US006829547B2

(12) United States Patent
Law et al.

(10) Patent No.: US 6,829,547 B2
(45) Date of Patent: **\*Dec. 7, 2004**

(54) MEASUREMENT TEST INSTRUMENT AND ASSOCIATED VOLTAGE MANAGEMENT SYSTEM FOR ACCESSORY DEVICE

(75) Inventors: William Q. Law, Beaverton, OR (US); Phillip D. Applebee, Canby, OR (US); Carl R. Matson, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 39 days.

This patent is subject to a terminal disclaimer.

(21) Appl. No.: 10/135,990

(22) Filed: Apr. 29, 2002

(65) Prior Publication Data

US 2003/0204342 A1 Oct. 30, 2003

(51) Int. Cl.[7] .............................................. G01R 19/00
(52) U.S. Cl. ............................. 702/64; 702/57; 702/58; 702/62; 702/81; 702/84
(58) Field of Search ........................... 702/100, 60, 64, 702/116

(56) References Cited

U.S. PATENT DOCUMENTS 4,600,010 A * 7/1986 Dugot ......................... 607/27
5,757,672 A * 5/1998 Hoepken ..................... 702/116
6,601,179 B1 * 7/2003 Jackson et al. ............. 713/322
6,629,048 B1 * 9/2003 Law et al. .................... 702/64
6,651,178 B1 * 11/2003 Voegeli et al. .............. 713/300
6,760,850 B1 * 7/2004 Atkinson et al. ........... 713/320

* cited by examiner

*Primary Examiner*—Marc S. Hoff
*Assistant Examiner*—Anthony Gutierrez
(74) *Attorney, Agent, or Firm*—William K. Bucher

(57) ABSTRACT

A measurement test instrument voltage management system for an accessory device has a accessory device interface that provides a voltage to a memory device in the accessory device. A sensing signal is generated when the accessory device is connected to the interface that causes an interrupt signal to be coupled to a controller. The controller retrieves accessory device data stored in the device memory via the interface and determines if the connected accessory device is a valid device capable of being supported by the measurement test instrument and voltage power requirements for the accessory device. The controller generates an enable signal for a valid and supported device that is coupled to a voltage switching circuit. The voltage switching circuit generates at least a first output voltage based on the voltage power requirements that is coupled to the accessory device via the interface to provide power to the accessory device.

21 Claims, 6 Drawing Sheets

MEASUREMENT TEST INSTRUMENT AND ASSOCIATED VOLTAGE MANAGEMENT SYSTEM FOR ACCESSORY DEVICE

BACKGROUND OF THE INVENTION

The present invention relates generally to measurement test instruments and more specifically to a measurement test instrument having a voltage management system for one or more accessory devices.

A typical measurement probe for acquiring electrical signals from a device under test has a probing head connected to a termination box via a transmission cable, such as a coaxial cable. The probing head has an electrically conductive hollow tube with a substrate disposed therein. The substrate has passive and/or active circuitry to prevent loading of the test device. One end of the hollow tube has an insulating plug disposed therein with a coaxially disposed probing tip or socket extending out of the plug in both directions. The portion of the probing tip or socket extending into the hollow body is electrically connected to the substrate. The other end of the substrate is coupled to one end of the transmission cable and to voltage power lines, clock lines and data lines, if present. The other end of the transmission cable is coupled to compensation circuitry in the termination box. The termination box has a coaxial signal connector, such as a BNC type connector, and power, clock and data connectors for connecting the measurement probe to a measurement test instrument, such as an oscilloscope or the like.

High frequency measurement probes require high input resistance and low input capacitance. Generally, these types of probes have an active FET input for low circuit loading and have a frequency bandwidth up to 4 Ghz or more. An example of such a probe is the P6245 Active FET Probe, manufactured and sold by Tektronix, Inc., Beaverton, Oreg. and assignee of the instant application. The P6245 has a male BNC type signal connector surrounded by a series of voltage, clock and signal pins as described in U.S. Pat. No. 4,708,661. The voltage pins provide ±5V and ±15V to the probe head and termination box circuitry and a memory device disposed in the termination box. The memory device preferably contains stored data related to the specific probe, such as probe type, correction factor values and offset values. A clock signal is provided to the memory device via the clock pin and the data stored in the memory is read out to the measurement instrument via the data pin.

A flexible or rigid printed circuit surrounds the mating female BNC connector on the front panel of the measurement test instrument. The printed circuit has a plurality of circuit paths ending in termination points. The pins of the measurement probe engage the termination points on the flexible printed circuit. The circuit paths are connected to voltage supplies, clock circuitry and the data line within the instrument and provide all of the signal and power lines to power and operate the active probe. When the measurement probe is connected to the measurement test instrument, power is immediately supplied to the probe.

The computer industry has developed techniques for adding and removing cards or peripheral devices from the powered computer system called "hot swapping". As the term implies, the connectors into which the card or peripheral device is plugged into have supply voltages on the voltage pins of the connectors. Various techniques are used to power-up the card or peripheral without generating an in-rush of current or loading the system power supplies. One technique uses variable length contacts on the card or peripheral to initially couple the voltage supplies on the connector to a RC ramping circuit and associated control circuitry. The RC circuit and associated circuitry ramps up the supply voltages on the card to a desired level before the voltages are supplied to the rest of the circuitry on the card. Another technique requires a user to power down a particular connector slot, insert the card or peripheral, and then power up the connector slot.

One drawback to the existing techniques of "hot swapping" is that the card or peripheral is powered up before the system determines the type of card or peripheral it is and configures it for the system. The system does not know if the card or peripheral is compatible, if it draws an excessive amount of current, or if the added card or peripheral will cause the total amount of current drawn by all of the connected devices to exceed the maximum current rating for the one or more of the power supplies. In addition, most of the "hot swapping" techniques require the RC network and switching circuitry to located in the card or peripheral device. Providing such circuitry in a measurement probe will increase the size of the termination box and add cost to the probe.

What is needed is a measurement test instrument voltage management system for accessory devices, such as a measurement probe, that verifies the connected device is a valid and supported device prior to applying power to the device. The voltage management system should also automatically select and provide the proper voltage levels to the accessory device. The voltage management system should also monitor each connected device to determine if a newly connected device results in excessive current draw from one or more power supplies. Further, the voltage management system should provide an indication of the presence of an invalid or unsupported device and if a newly connected device excessively loads the power supplies.

SUMMARY OF THE INVENTION

Accordingly, the present invention is to a measurement test instrument and associated voltage management system for one or more accessory devices, such as a measurement probe, video camera, signal source, probe amplifier, device under test or the like. The measurement test instrument includes at least a first accessory device having a memory device coupled to the voltage management system. The voltage management system has at least a first accessory device interface disposed in the measurement test instrument. The accessory device interface has a sensing line, a voltage input line, clock and data lines, and at least a first voltage power input line. The voltage input line provides a voltage to the memory device disposed in the accessory device. A sensing circuit receives a sensing signal from the accessory device via the interface sensing line when an accessory device is coupled to the accessory interface. The sensing circuit generates an interrupt signal in response to the sensing signal that is coupled to a controller. The controller initiates a clock signal to the accessory device via the interface clock line in response to the interrupt signal to retrieve accessory data stored in the memory device of the accessory device via the data line. The controller determines from the retrieved accessory data if the connected accessory device is a valid device and capable of being supported by the measurement test instrument and voltage power requirements, such as voltage power codes, for the accessory device. The accessory data may also include voltage power ramping codes for sequential power-up of the voltage powers to the accessory device. The controller generates an enable signal for a valid and supported device that is coupled along with at least a first voltage power code to a voltage switching circuit. The voltage switching circuit generates at least a first output voltage in response to the enable signal and the voltage power code that is coupled to the accessory device via the voltage power input line of the accessory device interface. In the preferred embodiment of the invention, the voltage power code is coupled to a programmable voltage regulator that includes a digital-to-analog converter and a variable voltage regulator.

In the preferred embodiment of the invention, the voltage switching circuit has a plurality of variable output voltages with each of the variable output voltages established by one of a plurality of voltage power codes coupled to one of a plurality of programmable voltage regulators. The variable output voltages are coupled to the accessory device via individual voltage power input lines of the accessory device interface. For a multi-channel measurement test instrument, the voltage management system has a plurality of accessory device interfaces with each interface capable of accepting an accessory device. Each device generates a sensing signal to the sensing circuit for generating an interrupt signal to the controller. The controller initiates a clock signal to each accessory device to retrieve the respective accessory data from each device to determine if the connected accessory device is a valid device and capable of being supported by the measurement test instrument and the voltage power requirement for the accessory device. The controller generates an enable signal for each valid and supported device and couples the enable signal along with at least a first voltage power code to the respective voltage switching circuits for each device. Each of the voltage switching circuits, preferably, has a plurality of variable output voltages with each of the variable output voltages established by one of a plurality of voltage power codes coupled to one of a plurality of programmable voltage regulators. The accessory data stored in each of the accessory device includes an output voltage current draw value for each of the output voltages which is retrieved by the controller. The controller has means for summing the current draw values for each of the output voltages for each attached accessory device and means for comparing the summed current draw values to maximum output voltage current draw values. The enable signal is supplied to the voltage switching circuit of the last connected accessory device when the summed current draw values are less than the maximum output voltage current draw values. The output voltage or voltages from the voltage switching circuit is removed from the voltage power input line or lines in response to the controller removing the enable signal to the voltage switching circuit when the interrupt signal is removed in response to the sensing signal being removed from the sensing circuit.

The measurement test instrument may be provided with a display device and the controller having means for generating a warning message that is displayed on the display device when an invalid and unsupported accessory device is connected to the device interface. The warning message generating means may also generate a warning message when an accessory device is connected to the measurement test instrument and the summed current draw values are greater than the maximum output voltage current draw value.

The objects, advantages and novel features of the present invention are apparent from the following detailed description when read in conjunction with appended claims and attached drawings.

DETAILED DESCRIPTION OF THE PREFERRED EMBODIMENT

Figure 1:
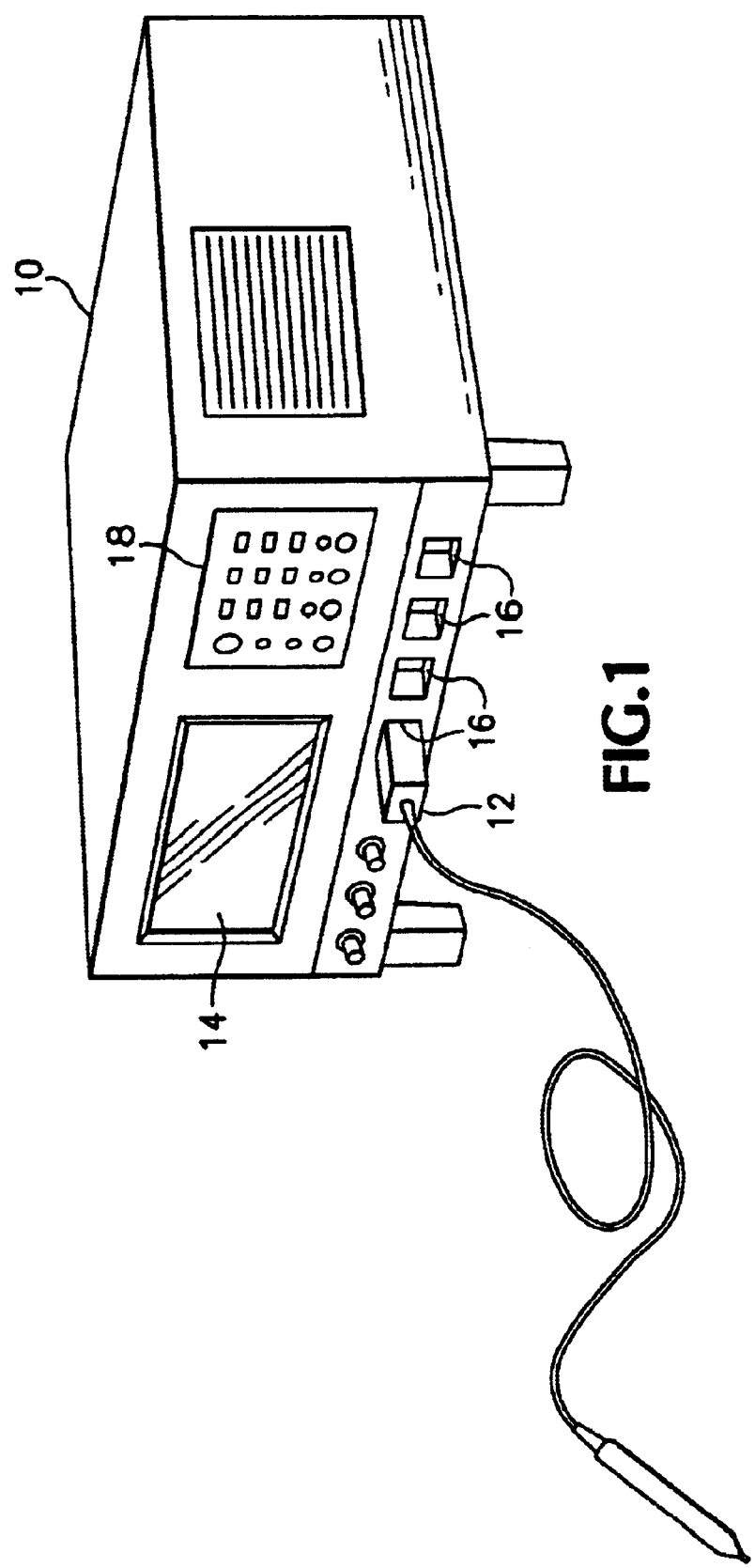
FIG. 1 is a perspective view of a measurement test instrument having an attached accessory device implementing the accessory device voltage management system according to the present invention.

Referring to FIG. 1, there is shown a measurement test instrument 10, such as an oscilloscope, logic analyzer, spectrum analyzer, network analyzer or the like having a plug-in accessory device 12, such as a measurement probe, signal source, video camera, probe amplifier or the like. In the preferred embodiment, the measurement test instrument 10 has a display device 14 on which is displayed a signal, video picture or the like from a device under test. One or more accessory interfaces 16 are provided in the measurement test instrument 10 for connecting multiple accessory devices to the instrument. Generally, the measurement test instrument 10 includes front panel controls 18, such as rotatable knobs, push buttons and the like for controlling the settings of the instrument. Alternatively, the front panel controls may be graphically generated and displayed on the display device 14 and controllable by the user. Each accessory interface 16 has a coaxial signal input line and a series of voltage power, clock, data, sensing and memory power lines as shown in greater detail in the representative block diagram of the measurement test instrument in FIG. 2.

Figure 2:
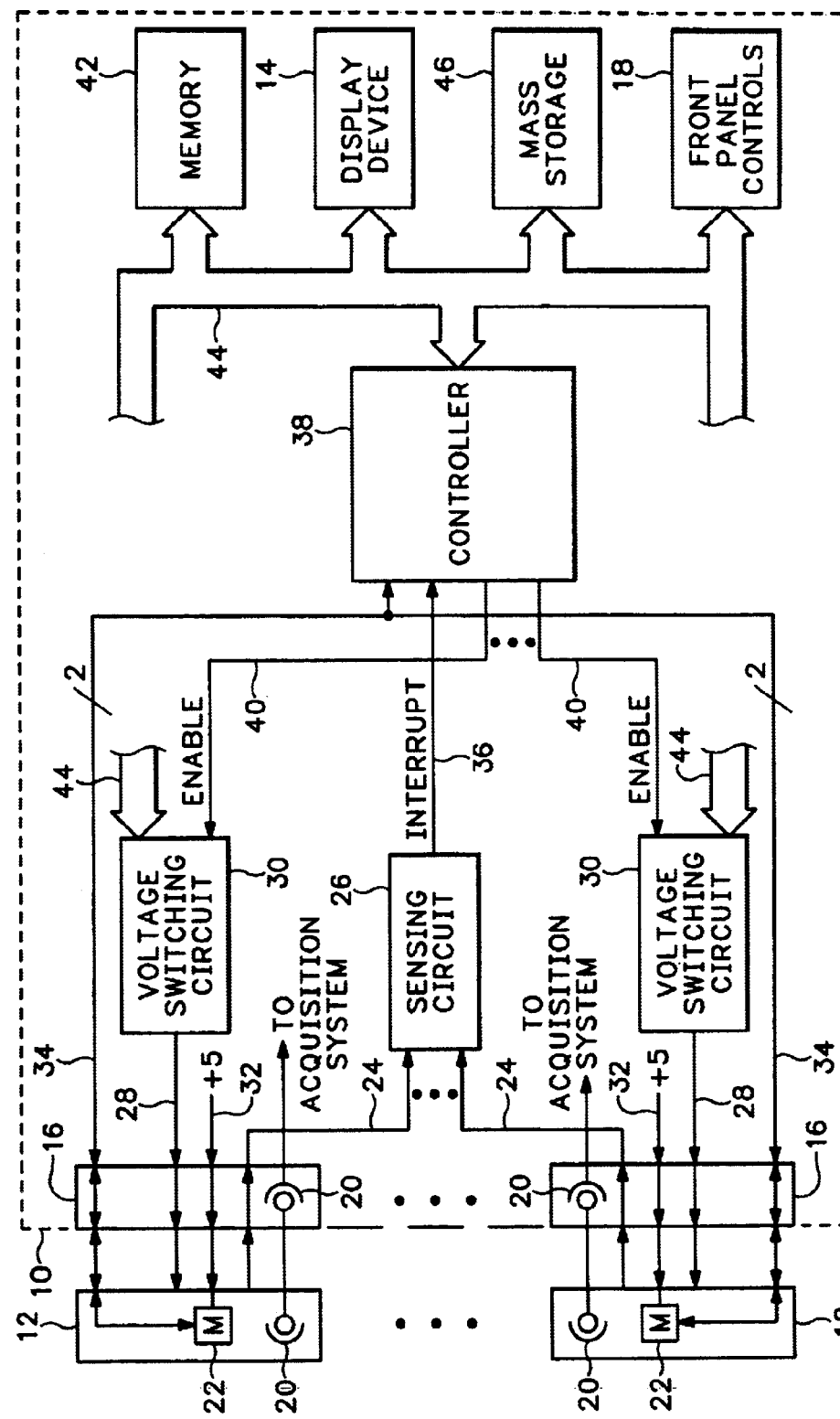
FIG. 2 is a representative block diagram of a measurement test instrument incorporating the accessory device voltage management system according to the present invention.

The block diagram of FIG. 2 shows one or more accessory devices 12 having the capability of being connected to one or more accessory interfaces 16 of the measurement test instrument 10. The accessory devices 12 have one-half of a signal input connector 20, such as a BNC connector, BMA connector or the like. The accessory device 12 also has a memory device 22, such as a EPROM that contains accessory device specific data, such a device type, calibration factors, offset values, voltage power codes, voltage power ramping codes, current draw values and the like. The accessory device 12 has connector pins or contacts that connect to corresponding contacts or pins in the accessory interface 16 to couple signals and voltage power to and from the device.

The accessory interface 16 has the other half of the signal input connector 20 and the pins or connects for connecting to the accessory device. In the preferred embodiment of the invention, the accessory interface 16 has gold plated pogo type pins that connect to contact pads in the accessory device 12. Each interface 16 has a sensing line 24 that is coupled to a sensing circuit 26. Each interface 16 also has one or more voltage power lines 28 that are coupled to corresponding voltage switching circuits 30 that provide selectable voltage power to the accessory device 12. A voltage line 32 is connected to each interface 16 to provide a voltage to the memory devices 22 of the connected device 12. Each interface further has clock/data lines 34 coupled to the memory device 22 for clocking out the data stored in the memory device. An interrupt line 36 couples the sensing circuit 26 to a controller 38. The clock/data lines 34 from the accessory interfaces 16 are also connected to the controller 38. Each voltage switching circuit 30 is connected to the controller 38 via an enable line 40.

The controller 38, such as CELERON™ or PENTIUM® microprocessor, manufactured and sold by Intel, Corp., Santa Clara, Calif., is coupled to memory 42 via a system bus 44. The memory 42 represents both RAM, ROM and cache memory with the RAM memory storing volatile data, such as voltage power codes and voltage power ramping codes from the accessory device, digital data samples of an input signal generated by an acquisition system (not shown), and the like. The system bus 44 is also connected to the display device 14, such a liquid crystal display, cathode ray tube or the like, and to the front panel controls 18 which may include control entry devices, such as a keyboard and/or mouse as well as knobs and buttons. A mass storage unit or units 46, such as a hard disk drive, CD ROM drive, tape drive, floppy drive or the like that reads from and/or writes to appropriate mass storage media, may also be connected to the system bus 44. Program instructions for controlling the measurement test instrument 10, implementing the voltage management system may be stored and accessed from the ROM memory 42 or from the mass storage media of the mass storage unit 46. The measurement test instrument is preferably a PC based system controlled under WINDOWS® 98 operating system, manufactured and sold by Microsoft, Corp., Redmond, Wash. or similar types of operating systems. The controller 38 in the above described measurement test instrument may also be implemented using multiple controllers and digital signal processing devices. For example, a second controller, such as a Power PC microprocessor manufactured and sold by Motorola, Inc., Schaumburg, Ill., may be included to control the acquisition and processing of an input data signal. The display device 14 may be controlled by a display controller receiving display instructions from a main controller and receiving display data from a digital signal processing device. A bus controller may also be included to monitor the accessory interfaces 16 for connected accessory devices 12, provide communications between the accessory interfaces 16, the sensing circuit 26 and the controller 38.

The general operation of the measurement test instrument 10 with the voltage management system starts with an accessory device 12 being connected to one of the accessory interfaces. The accessory device 12 connection causes a sensing signal to be generated on the sensing line 24 that is coupled to the sensing circuit 26. The sensing circuit 26 generates an interrupt signal on interrupt line 36 in response to the sensing signal. The interrupt signal is coupled to the controller 38 which processes the interrupt and generates, under program control, a clock signal that is coupled to the accessory device 12 via the accessory interface 16. The clock signal clocks out the accessory device data stored from the memory 22 to the controller 38. The accessory data includes accessory device identity information, and preferably voltage power codes that set the voltage power output levels for the voltage switching circuit 30. The accessory device data may also include voltage power ramping codes that vary the ramp-up times of the voltage levels of the voltage switching circuit. Alternately, the accessory device identity data may be used to access voltage power and ramp-up codes stored in ROM memory 42 that are coupled to the voltage switching circuit 30. The advantage of storing the voltage power and voltage power ramping codes in the accessory device memory 22 is that new accessory devices that may have different voltage and power-up requirements without having to modify the ROM memory 42 in the host measurement test instrument.

The controller 38 receives the accessory device data and determines from the data if the accessory device is a valid device and supported by the measurement test instrument 10. For example, if the accessory device implements an accessory feature that is not supported by the measurement test instrument or requires more current than is available from the instrument, the controller 38 treats the device 12 as an unsupported probe. The controller 38 generates an enable signal in response to a valid and supported accessory device that is coupled to the voltage switching circuit 30 via enable line 40. The controller 38 also passes the voltage power codes to the voltage switching circuit 30 via the system bus 44. The voltage switching circuit 30 generates an output supply voltage or voltages defined by the voltage power code or codes via the voltage line or lines 28 to power the accessory device 12. If an invalid or unsupported accessory device 12 is connected to the accessory interface 16, the controller 38 does not generate an enable message to the voltage switching circuit 30 and power is not supplied to the accessory device 12. Additionally, the controller 38 may also generate an error message that is displayed on the displayed device 14 indicating that the connected device 12 is an invalid or unsupported device.

Further, the data stored in the accessory device memory 22 may include a current draw value indicating how much current the device will draw from the instrument power supply. Memory 42 has maximum current draw values indicating the maximum amount of current any configuration of accessory devices 12 may draw from the instrument power supply. The controller, operating under program control, sums the current draw values of the connected accessory devices 12 and compare the summed value with the maximum current draw value. If the current draw value of the last connected accessory device makes the summed current draw values exceed the maximum current draw value, the controller 38 does not generate the enable signal for the last connected device. The controller 38 may also generate an error message that is displayed on the display device indicating the last connected accessory device 12 is not powered due to excessive current draw on the power supply.

Removing the accessory device 12 from the accessory interface 16 removes the sensing signal on the sensing line 24, which causes an interrupt to be generated that is coupled to the controller 38 via the interrupt line 36. The controller 38 removes the enable signal on the enable line 40 causing the voltage switching circuit 30 to remove the voltage power to the interface 16.

Figure 3:
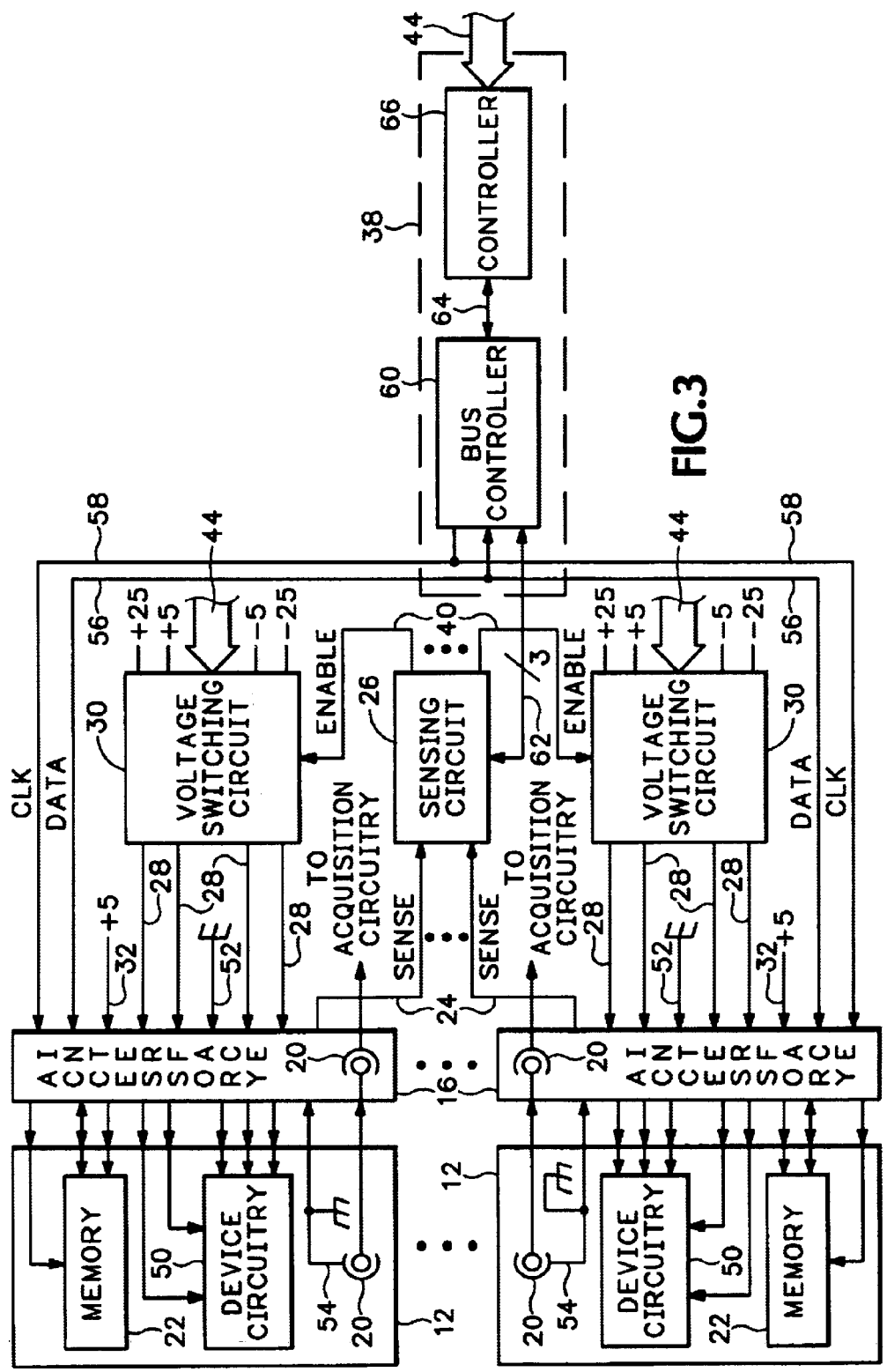
FIG. 3 is a more detailed block diagram of the preferred embodiment of the measurement test instrument incorporating the accessory device voltage management system according to the present invention.

Referring to FIG. 3, there is shown a more detailed block diagram of the measurement test instrument 10 with the accessory device voltage management system illustrating the preferred embodiment of the present invention. Like elements from the previous drawing are labeled the same. Each accessory device 12 has a memory device 22 that receives a voltage supply via voltage line 32 when the accessory device 12 is connected to the accessory interface 16. Each device may have circuitry 50 that receives voltage power from the voltage switching circuit 30 associated with the accessory interface 16 via voltage output lines 28. The voltage switching circuit 30 provides selectable voltages to power the circuitry 50 in the accessory device 12. Instrument ground is provided to each accessory devices 12 via a ground line 52 connected to each of the accessory interfaces 16. Each accessory device 12 has a sensing output connection 54 coupled to the sensing line 24. In the preferred embodiment of the invention, the sensing output connection 54 is coupled to electrical ground which generates an active low output on the sensing line 24. Each interface has clock and data lines 56 and 58, corresponding to clock/data line 34 in FIG. 2, that are coupled to the memory device 22. To relieve the main controller 38 from continually monitoring and communicating with the accessory interfaces 16 and the sensing circuit 26, the data and clock lines 56 and 58 are coupled to a bus controller 60 that generates a clock output signal on the clock line 58 and receives data from the accessory device memory 22 on the data line 56. The sensing circuit 26 is connected to the bus controller 60 via a three line communications bus 62, corresponding to interrupt line 36 in FIG. 2, that includes an interrupt line, a clock line and a data line. The bus controller 60 is coupled by another serial bus 64, such as an RS232 type bus having TTL logic levels, to a system controller 66. Alternately, the interrupt line from the sensing circuit may be coupled directly to the controller 38. The enable lines 40 in the preferred embodiment are coupled from the sensing circuit 28 to the voltage switching circuit 30. The system controller 66 is coupled to the previously described peripheral device 14, 18, 42 and 48 via system bus 44.

Figure 4:
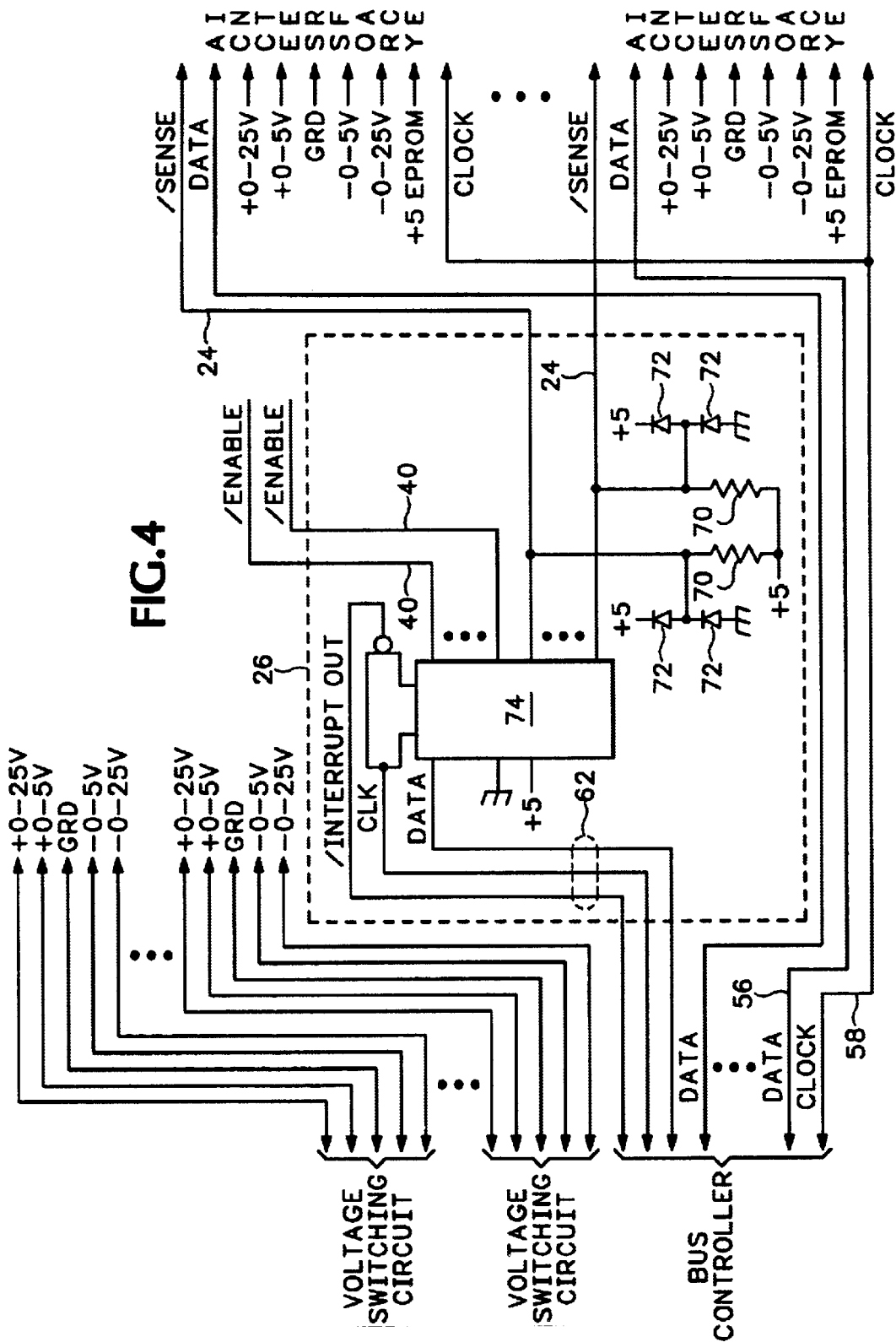
FIG. 4 is a representative diagram of the sensing circuit in the voltage management system according to the present invention.
Figure 5:
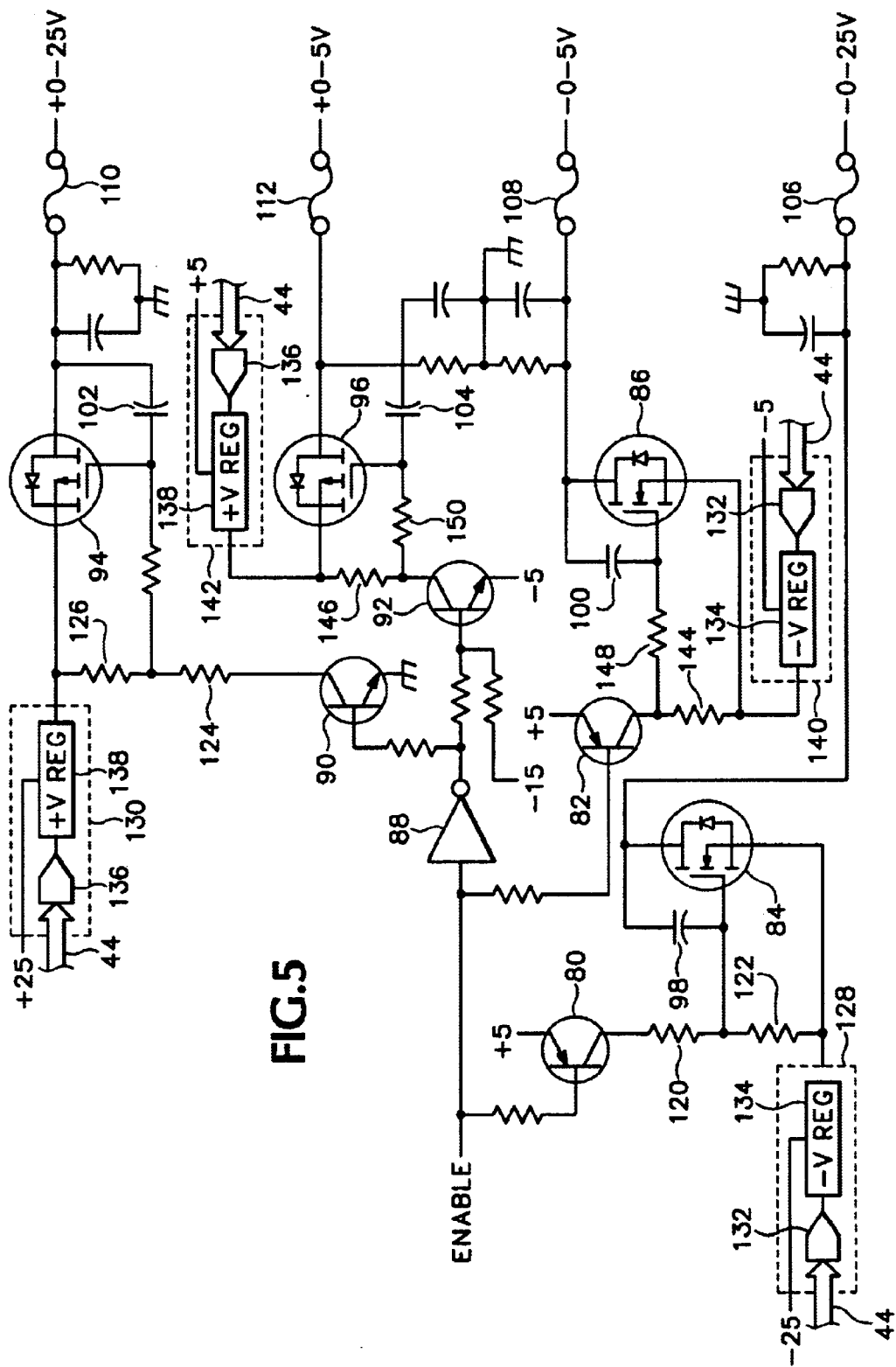
FIG. 5 is a representative schematic diagram of the voltage switching circuit in the voltage management system according to the present invention.

Referring to FIG. 4, there is shown a representative schematic diagram of the sensing circuit 28, which in conjunction with FIGS. 3 and 5 will be used to describe the voltage management system in the measurement test instrument 10. Each accessory interface 16 has a sensing line 24 that is coupled to the sensing circuit 26. The sensing circuit sets each of the sensing lines 24 to an active high state by applying a positive voltage to the lines 24 via resistors 70. Excessive voltage protection for the lines 24 is provided by diodes 72. Connecting an accessory device 12 to the accessory interface 16 couples the sensing line 24 to the electrically grounded sensing output connection 54 which generates an active low signal to the sensing circuit 26. Alternately, the sensing lines 24 may be set to an active low state and the accessory device 12 generates an active high signal by using the memory voltage supply. The sensing lines 24 are coupled to an I/O expander integrated circuit 74, such as manufactured by Philips Semiconductor Products, Sunnyvale, Calif., under part number PCF8574A. The I/O expander 74 provides remote I/O expansion for the bus controller 60 via a two-line serial bidirectional bus of the communications bus 62 having the clock and data lines. The expander 74 also has an interrupt output which is connected to interrupt logic in the bus controller 60 via the interrupt line of the communications bus 62. By sensing an interrupt signal on this line, the remote I/O expander 74 can inform the bus controller 60 that there is incoming data on its ports without having to communicate via the serial bidirectional bus.

As previously stated, connecting the accessory device 12 to one of the accessory interfaces 16 generates an active low signal on the sensing line 24 which causes the I/O expander 74 to generate an active low interrupt signal that is coupled to the bus controller 60 via communications bus interrupt line 62. The controller 60 or controller 66, if the sensing circuit interrupt line is coupled to that controller, in return polls the sensing lines 24 to determine which line has been changed to the active low. The bus controller 60 passes the sensing line information to the controller 66 via serial bus 64. The controller 66 in return instructs the bus controller 60 to initiate a clock signal that is coupled to the connected accessory device 12 via clock line 58. The clock signal clocks out the data stored in memory 22 via data line 56 to the bus controller 60 which in turn couples the data to the controller 66 via serial bus 64. The accessory device data is processed by the controller 66 under the control of stored programs in memory 42 to verify if the connected accessory device 12 is valid and supported by the measurement test instrument 10. Once the processor 66 has determined that the accessory device is valid and supported, it loads the appropriate voltage power code or codes passed from the accessory device memory 22 into the voltage switching circuit 30 and signals the bus controller 60 to enable the voltage switching circuit 30 connected to the accessory interface 16. The bus controller 60 uses a stored protocol to clock data into the I/O expander 54 via the clock and data lines of the communications bus 62 to load values into a plurality of output latches with each output latch connected to one of the enable lines 40. The output latch of the active accessory interface connector provides an active low enable signal that is coupled to the voltage switching circuit 30 connected to the active interface.

FIG. 5 is a representative schematic diagram of the voltage switching circuit 30 that generates output voltages which are applied to the accessory interface via voltage lines 28. In the preferred embodiment, the voltage switching circuit 30 generates selectable voltage levels from ±0–5 volts and ±0–25 volts. However, the voltage switch circuit 30 may be implemented from one to any number of selectable output voltages without departing from the scope of the present invention. The active low enable signal is coupled to the respective bases of bipolar transistors 80 and 82 that drive respective field effect transistors FET 84 and 86. The enable signal is also coupled through inverter 88 to the respective bases of bipolar transistors 90 and 92 that drive respective FET transistors 94 and 96. The FET transistors 84, 86 94 and 96 are high current devices having four source connections, three drain connections, and a gate connection, such as manufactured by Fairchild Semiconductor Corp., South Portland, Me., with FET transistors 84 and 86 sold under part number FDS6690A and FET transistors 94 and 96 sold under part number FDS9435A. Integrating capacitors 90, 100, 102 and 104 are respectively coupled between the gate and the drain of each FET transistor 84, 86, 94 and 96. The voltage output of each FET transistor 84, 86, 94 and 96 is coupled through a poly fuse 106, 108, 110 and 112 to the respective accessory interface 16 via voltage power lines 28 connected to the voltage switching circuit 30.

An active high signal on the drive transistors 80, 82 and an active low signal on the drive transistors 90 and 92 bias the transistors to a nonconductive off state. The transistors are biased into conduction by the application of the active low enable signal to the bases of transistors 80 and 82 and the invented enable signal on the bases of transistors 90 and 92. The collectors of drive transistors 80 and 90 have series connected voltage divider resistors 120 and 122, and 124 and 126 that are coupled to respective negative and positive programmable voltage regulators 128 and 130. The programmable voltage regulator 128 is coupled to a negative voltage source, such as a −25 volt supply voltage from the measurement test instrument 10. The programmable voltage regulator 128 is coupled to the system bus that provides the selected voltage power code for the negative voltage source. The voltage power code is applied to a digital-to-analog converter 132 that generates an analog voltage control signal that is applied to an adjustment input terminal of an adjustable voltage regulator 134, such as manufactured and sold by National Semiconductor, Inc., Santa Clara, Calif., under part number LM337. The output terminal of the adjustable voltage regulator 134 is coupled to the voltage divider network of resistors 120 and 122 and to the source electrode of FET 84. The programmable voltage regulator 130 is of similar design to the programmable voltage regulator 128 with the regulator 130 coupled to a positive voltage source, such as a +25 volt supply voltage from the measurement test instrument 10. The programmable voltage regulator 130 receives the selected voltage supply code for the positive voltage source via the system bus 44 that is applied to a digital-to-analog converter 136. The analog output from the digital-to-analog converter 136 is applied to an adjustment terminal of an adjustable voltage regulator 138, such as manufactured and sold by National Semiconductor, Inc., Santa Clara, Calif., under part number LM317. The output terminal of the adjustable voltage regulator 138 is coupled to the voltage divider network of resistors 124 and 126 and to the source electrode of FET 94. The center taps of the respective voltage divider networks 120, 122 and 124 and 126 are coupled the gates of the FET transistors 84 and 94.

The collectors of drive transistors 82 and 92 are coupled through resistors 144 and 146 to the outputs of respective negative and positive programmable voltage regulators 140 and 142. The programmable voltage regulator 140 is of the same design as regulator 128 and programmable voltage regulator 142 is of the same design as regulator 130. The programmable voltage regulator 140 is coupled to a −5 volt source from the measurement test instrument and the programmable voltage regulator 142 is coupled to a +5 volt source from the measurement test instrument. The selected voltage power codes for the programmable voltage regulator 140 and 142 are received via the system bus 44. The respective voltage power codes for the programmable voltage regulators 140 and 142 are coupled to respective digital-to-analog converters 132 and 136. The analog outputs from the digital-to-analog converters 132 and 136 are coupled to the adjustment terminals of the respective adjustable voltage regulators 134 and 138. The output terminals of the adjustable voltage regulators 134 and 138 of the programmable voltage regulator 140 and 142 are respectively applied to the source electrodes of FETs 86 and 96. The gates of FET transistors 86 and 96 are biased by biasing resistors 148 and 150 that are coupled to respective positive and negative voltage sources through the drive transistors 82 and 92. The voltages on the gates of the FET transistors drive the devices into conduction. The integrating capacitors 98, 100, 102 and 104 on each of the FET transistors 84, 86, 94 and 96 ramps the voltage outputs on the drain terminals of the FET transistors to the operating levels set by the programmable voltage regulators 128, 130, 140 and 142. The values of the integrating capacitors determine the slopes of the ramping voltage outputs and hence the times required to reach the operating levels. The values of the capacitors may be set so that the voltage output levels from FETs 86 and 96 reach operating levels before the voltage output levels of FETs 84 and 94. However, it is preferable to control the ramping voltage output of the FETs 84, 86, 94 and 96 based on the output voltage power set by the voltage power codes.

Figure 6:
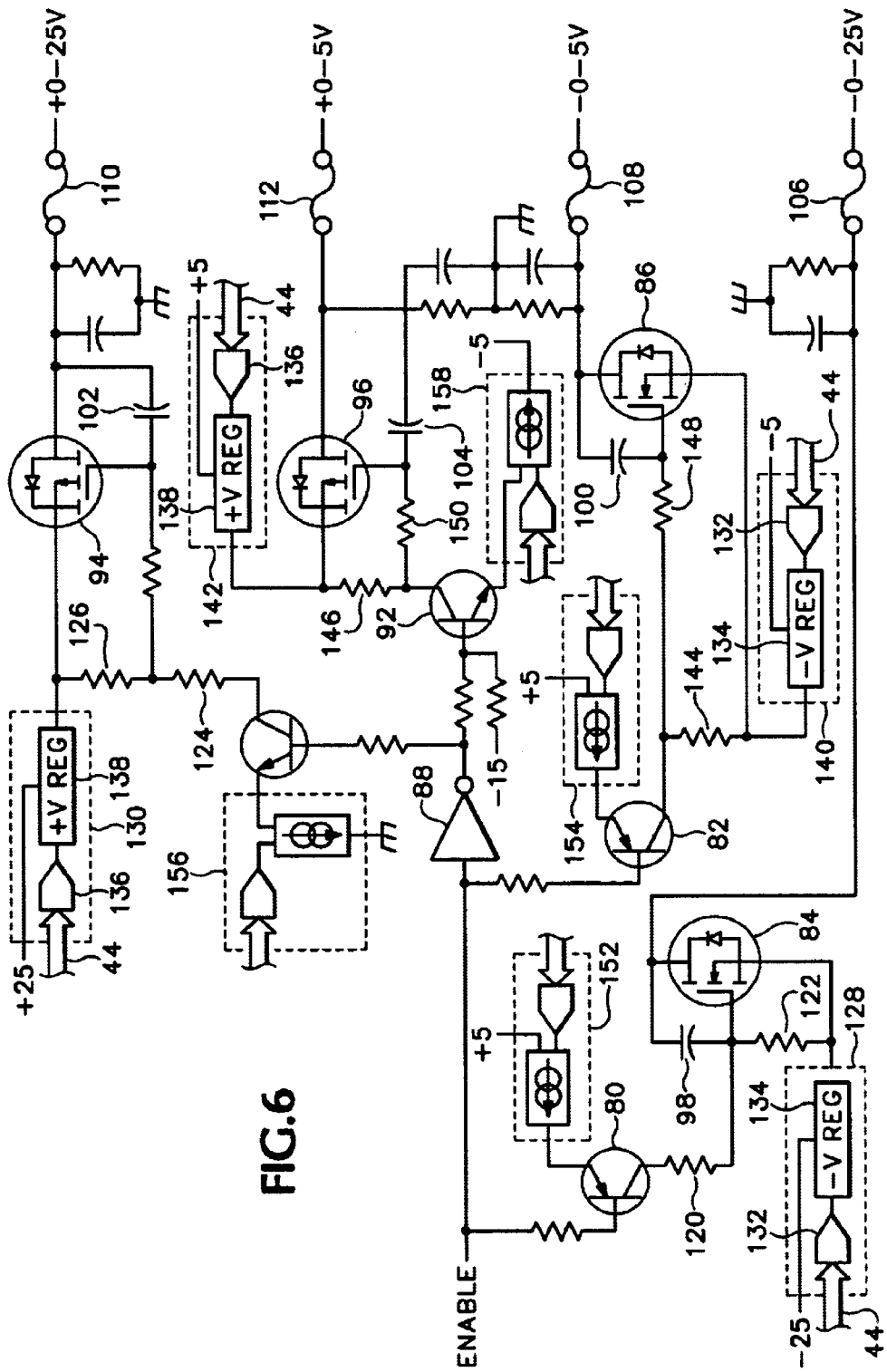
FIG. 6 is a representative schematic diagram of the variable voltage power ramping voltage switching circuit in the voltage management system according to the present invention.

FIG. 6 is a representative schematic diagram of the voltage switching circuit 30 having variable ramping voltage outputs. Like elements from FIG. 5 are labeled the same in FIG. 6. The emitters of each of the drive transistors 80, 82 90 and 92 are coupled to programmable current sources 152, 154, 156, and 158 instead of fixed voltage levels. Each of the programmable current sources 152, 154, 156, and 158 is coupled to a fixed voltage level and system bus 44. The system bus 44 provides the voltage power ramping codes from the accessory device data. The voltage power ramping codes are coupled to respective digital-to-analog converters 160 in each programmable current source 152, 154, 156, and 158 that produce analog output values to variable current source 162. The analog output values varies the amount of charging current supplied to the respective integrating capacitors 98, 100, 102 and 104, which in turn, varies the slope of the respective voltage outputs from the FETs 84, 86, 90 and 94.

As was described in the general operation of the voltage switching system in the measurement test instrument 10, the controller 38 has means for generating a message when the connected accessory device is not valid or supported by the measurement test instrument 10. Further, the accessory devices have stored current draw values for each of the voltage supplies. The controller 38 also has means for summing each of the current draw values and means for comparing each of the summed value with stored maximum current draw values for each voltage supply.

A measurement test instrument and associated voltage management system has been described having one or more accessory device interfaces that receive accessory devices. Each accessory device has a memory device coupled to the voltage management system for receiving a voltage via a voltage input line of the voltage management system. The accessory device interface has a sensing line, a voltage input line, clock and data lines, and at least a first voltage power input line. A sensing circuit receives a sensing signal from the accessory device via the interface sensing line when an accessory device is coupled to the accessory interface. The sensing circuit generates an interrupt signal in response to the sensing signal that is coupled to a controller. The controller initiates a clock signal to the accessory device via the interface clock line in response to the interrupt signal to retrieve accessory data stored in a memory device of the accessory device via the data line. The controller determines from the retrieved accessory data if the connected accessory device is a valid device and capable of being supported by the measurement test instrument and voltage power requirements, such as voltage power codes and voltage power ramping codes, for the accessory device. The controller generates an enable signal for a valid and supported device that is coupled to a voltage switching circuit. The voltage switching circuit generates at least a first variable output voltage in response to the enable signal and the voltage power code that is coupled to the accessory device via the voltage power input line of the accessory device interface. In the preferred embodiment, the voltage switching circuit includes a plurality of variable output voltages that may be sequentially ramped-up to their operating levels by voltage power ramping codes.

In the preferred embodiment of the invention, the controller may include multiple controllers for performing concurrent program executions. A bus controller is provided that is coupled to the sensing circuit, the accessory device interfaces and the main controller. The bus controller receives and passes on an interrupt signal from the sensing circuit to the main controller. The controller causes the bus controller to poll that sensing circuit to determine which accessory interface has had an accessory device connected to it. The controller then initiates the generation of a clock signal from the bus controller to retrieve the stored data from the accessory interface. The main controller processes the retrieved data to determine if the connected device is a valid and supported device and issues an enable command to the bus controller. The bus controller outputs a stored protocol to the sensing circuit that generates an enable signal to the voltage switching circuit.

The measurement test instrument may be provided with a display device with the controller having means for generating a warning message that is displayed on the display device when an invalid and unsupported accessory device is connected to the device interface. The warning message generating means may also generate a warning message when an accessory device is connected to the measurement test instrument and the summed current draw values are greater than the maximum output voltage current draw value.

It will be obvious to those having skill in the art that many changes may be made to the details of the above-described embodiments of this invention without departing from the underlying principles thereof. The scope of the present invention should, therefore, be determined only by the following claims.

What is claimed is:

1. A measurement test instrument voltage management system for an accessory device comprising:
    at least a first accessory device interface disposed in the measurement test instrument having a sensing line, a voltage input line, clock and data lines, and at least a first voltage power input line wherein the voltage input line provides a voltage to a memory device disposed in the accessory device;
    a sensing circuit receiving a sensing signal from the accessory device via the interface sensing line when the accessory device is coupled to the accessory device interface of the measurement test instrument with the sensing circuit generating an interrupt signal in response to the sensing signal;
    a controller receiving the interrupt signal and initiating a clock signal to the accessory device via the interface clock line to retrieve accessory data stored in a memory device of the accessory device via the data line to determine if the connected accessory device is a valid device and capable of being supported by the measurement test instrument and identifying voltage power requirements of the accessory device, the controller initiating the generation of an enable signal for a valid and supported device and at least a first voltage power code for the identified voltage power requirements; and
    at least a first voltage switching circuit coupled to receive the enable signal and the voltage power code for generating at least a first output voltage having the identified voltage power requirement that is coupled to the accessory device via the voltage power input line of the accessory device interface.

2. The voltage management system as recited in claim 1 further comprising an enable line coupled between the sensing circuit and the voltage switching circuit with the sensing circuit having an enable signal latch connected to the enable line that generates the enable signal in response to the controller issuing an enable signal initiation command.

3. The voltage management system as recited in claim 2 wherein the controller is a main controller further comprising a bus controller coupled to the accessory interface via the bus and clock lines and having a communications bus that includes an interrupt line, a data line and a clock line coupled to the sensing circuit and a serial bus connected to the main controller with the bus controller coupling the interrupt signal from the sensing circuit to the main controller and generating the clock signal to the accessory device in response to the main controller issuing a clock initiation command and passing the accessory device data to the main controller and passing the enable signal to the sensing circuit in response to the main controller issuing an enable signal command.

4. The voltage management system as recited in claim 1 wherein the measurement test instrument has a display device and the controller further comprises a means for generating a warning message that is displayed on the display device when an invalid and unsupported accessory device is connected to the device interface.

5. The voltage management system as recited in claim 1 wherein the output voltage from the voltage switching circuit is removed from the voltage power input line in response to the controller initiating the removal of the enable signal to the voltage switching circuit when the interrupt signal is removed in response to the sensing signal being removed from the sensing circuit.

6. The voltage management system as recited in claim 1 wherein the voltage switching circuit further comprises a programmable voltage regulator receiving a voltage signal from the voltage switching circuit and the voltage power code from the controller and generating at least the first output voltage in response to the voltage power code.

7. The voltage management system as recited in claim 1 wherein the voltage switching circuit further comprises a programmable current source receiving a voltage signal from the voltage switching circuit and a voltage power ramping code from the controller to cause at least the first variable ramping output voltage to be generated in response to the voltage power ramping code.

8. The voltage management system as recited in claim 6 wherein the voltage switching circuit further comprises a plurality of programmable voltage regulators with each programmable voltage regulator receiving a voltage signal from the voltage switching circuit and a voltage power code from the controller with the voltage switching circuit generating a plurality of output voltages in response to the voltage power codes that are coupled to the accessory device via a plurality of voltage power input lines of the accessory device interface.

9. The voltage management system as recited in claim 8 wherein the voltage switching circuit further comprises a plurality of programmable current sources with each programmable current source receiving a voltage signal from the voltage switching circuit and a voltage power ramping code from the controller to cause a plurality of variable ramping output voltages to be generated in response to the voltage power ramping code.

10. The voltage management system as recited in claim 8 wherein the plurality of output voltages from the voltage switching circuit are removed from the plurality of voltage power input lines in response to the controller initiating the removal of the enable signal to the voltage switching circuit when the interrupt signal is removed in response to the sensing signal being removed from the sensing circuit.

11. The voltage management system as recited in claim 1 further comprising:
    a plurality of accessory device interfaces with each interface capable of accepting an accessory device that generates a sensing signal to the sensing circuit for generating an interrupt signal to the controller with the controller initiating a clock signal to each accessory device to retrieve the respective accessory data from each device to determine if the connected accessory device is a valid device and capable of being supported by the measurement test instrument and identifying voltage power requirements of each of the accessory devices, the controller initiating the generation of an enable signal for each valid and supported device and at least a first voltage power code for the identified voltage power requirements of each accessory device; and a plurality of voltage switching circuits with each voltage switching circuit coupled to receive the enable signal and the voltage power code from the controller for the connected accessory device and generating at least a first output voltage having the identified voltage power requirement that is coupled to the accessory device via the voltage power input line of the accessory device interface.

12. The voltage management system as recited in claim 11 further comprising a plurality of enable lines with each enable line coupled between the sensing circuit and one of the plurality of voltage switching circuits with the sensing circuit having a plurality of enable signal latches with each latch connected to one of the enable lines to generate the enable signal in response to the controller issuing an enable signal initiation command.

13. The voltage management system as recited in claim 12 wherein the controller is a main controller further comprising a bus controller coupled to the plurality of accessory interfaces via the bus and clock lines and having a communications bus that includes an interrupt line, a data line and a clock line coupled to the sensing circuit and a serial bus connected to the main controller with the bus controller coupling the interrupt signal from the sensing circuit to the main controller and generating the clock signal to the plurality of accessory devices in response to the main controller issuing a clock initiation command and passing the accessory device data to the main controller and passing the enable signal to the sensing circuit in response to the main controller issuing an enable signal command.

14. The voltage management system as recited in claim 11 wherein each of the plurality of voltage switching circuits further comprises a programmable voltage regulator receiving a voltage signal from the voltage switching circuit and the voltage power code from the controller and generating at least the first output voltage in response to the voltage power code.

15. The voltage management system as recited in claim 14 wherein each of the plurality of voltage switching circuits further comprises a programmable current source receiving a voltage signal from the voltage switching circuit and a voltage power ramping code from the controller to cause at least the first variable ramping output voltage to be generated in response to the voltage power ramping code.

16. The voltage management system as recited in claim 14 wherein each of the plurality of voltage switching circuits further comprises a plurality of programmable voltage regulators with each programmable voltage regulator receiving one of a plurality of voltage signals from the voltage switching circuit and a voltage power code from the controller with each of the plurality of voltage switching circuits generating a plurality of output voltages in response to the voltage power codes that are coupled to the connected accessory device via a plurality of voltage power input lines of the accessory device interface.

17. The voltage management system as recited in claim 16 wherein each of the plurality of voltage switching circuits further comprises a plurality of programmable current sources with each programmable current source receiving one of a plurality of voltage signals from the voltage switching circuit and one of a plurality of voltage power ramping codes from the controller to cause one of a plurality of variable ramping output voltages to be generated in response to the voltage power ramping code.

18. The voltage management system as recited in claim 16 wherein the accessory data stored in each of the accessory device includes output voltage current draw values for each of the plurality of output voltages with the controller further comprising a means for summing the current draw values for each of the output voltages for each attached accessory device and a means for comparing the summed current draw values for each of the output voltages to a maximum output voltage current draw values for each of the output voltages and initiating the generation of the enable signal when the summed current draw values for each of the output voltages are less than the maximum output voltage current draw values.

19. The voltage management system as recited in claim 18 wherein the controller further comprises means for generating a warning message that is displayed on the display device when an accessory device is connected to the measurement test instrument and the summed current draw values for each of the output voltages are greater than the maximum output voltage current draw values.

20. The voltage management system as recited in claim 11 wherein the accessory data stored in each of the accessory device includes an output voltage current draw value with the controller further comprising a means for summing the current draw values for each attached accessory device and a means for comparing the summed current draw values to a maximum output voltage current draw value and initiating the generation of the enable signal when the summed current draw value is less than the maximum output voltage current draw value.

21. The voltage management system as recited in claim 20 wherein the controller further comprises means for generating a warning message that is displayed on the display device when an accessory device is connected to the measurement test instrument and the summed current draw values are greater than the maximum output voltage current draw value.

* * * * *